United States Patent
Yang

(10) Patent No.: US 12,107,116 B2
(45) Date of Patent: Oct. 1, 2024

(54) METHOD FOR MAKING MICRO-LED DISPLAY PANEL

(71) Applicant: Century Technology (Shenzhen) Corporation Limited, Shenzhen (CN)

(72) Inventor: Chiao-Yu Yang, Shenzhen (CN)

(73) Assignee: Century Technology (Shenzhen) Corporation Limited, Shenzhen (CN)

(*) Notice: Subject to any disclaimer, the term of this patent is extended or adjusted under 35 U.S.C. 154(b) by 0 days.

(21) Appl. No.: 18/538,202

(22) Filed: Dec. 13, 2023

(65) Prior Publication Data

US 2024/0113153 A1    Apr. 4, 2024

Related U.S. Application Data

(62) Division of application No. 17/121,592, filed on Dec. 14, 2020, now Pat. No. 11,881,499.

(30) Foreign Application Priority Data

Aug. 10, 2020  (CN) .......................... 202010794487.0

(51) Int. Cl.
| | |
|---|---|
| H01L 27/15 | (2006.01) |
| H01L 33/00 | (2010.01) |
| H01L 33/38 | (2010.01) |
| H01L 33/62 | (2010.01) |

(52) U.S. Cl.
CPC .......... *H01L 27/156* (2013.01); *H01L 33/005* (2013.01); *H01L 33/38* (2013.01); *H01L 33/62* (2013.01); *H01L 2933/0016* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 2011/0315956 | A1 | 12/2011 | Tischler et al. |
| 2017/0338212 | A1* | 11/2017 | Kuo ...................... H01L 25/167 |
| 2018/0247973 | A1 | 8/2018 | Daikoku et al. |
| 2019/0115333 | A1* | 4/2019 | Wu ......................... H01L 33/54 |
| 2019/0333897 | A1* | 10/2019 | Chen .................. H01L 25/0753 |
| 2020/0259050 | A1 | 8/2020 | Wu et al. |
| 2021/0050495 | A1* | 2/2021 | Yang ...................... H01L 33/62 |
| 2021/0175278 | A1 | 6/2021 | Lo et al. |

FOREIGN PATENT DOCUMENTS

| | | |
|---|---|---|
| CN | 109494216 A | 3/2019 |
| JP | 2000-504153 A | 4/2000 |
| TW | 201806191 A | 2/2018 |

\* cited by examiner

*Primary Examiner* — Mark W Tornow
*Assistant Examiner* — Priya M Rampersaud
(74) *Attorney, Agent, or Firm* — ScienBiziP, P.C.

(57) ABSTRACT

A method for making a micro-LED display panel includes providing a substrate; transferring micro-LEDs on a surface of the substrate; transferring conductive blocks on the surface of the substrate having the micro-LEDs; forming an insulating layer to cover the micro-LEDs and the conductive blocks; forming upper electrodes, each of the upper electrodes covering a surface of one of the micro-LEDs away from the substrate; and forming top wires on a surface of the insulating layer away from the substrate.

8 Claims, 5 Drawing Sheets

METHOD FOR MAKING MICRO-LED DISPLAY PANEL

FIELD

The subject matter herein generally relates to displays, particularly relates to a method for making the micro light emitting diode (micro-LED) display panel.

BACKGROUND

A micro-LED display panel generally includes a plurality of micro-LEDs arranged in a matrix. Each micro-LED has an upper end and a lower end, an upper electrode is formed on the upper end, and a lower electrode is formed on the lower end. Both the upper electrode and the lower electrode are electrically connected to a driving circuit by metal lines and are fed with different voltages to form a voltage difference, then the micro-LED will emit light. The metal line connected between the driving circuit and the upper electrode needs to climb a slope to overcome a height differential of the micro-LED (about 30-50 microns). However, the metal line is prone to breaking at this location.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
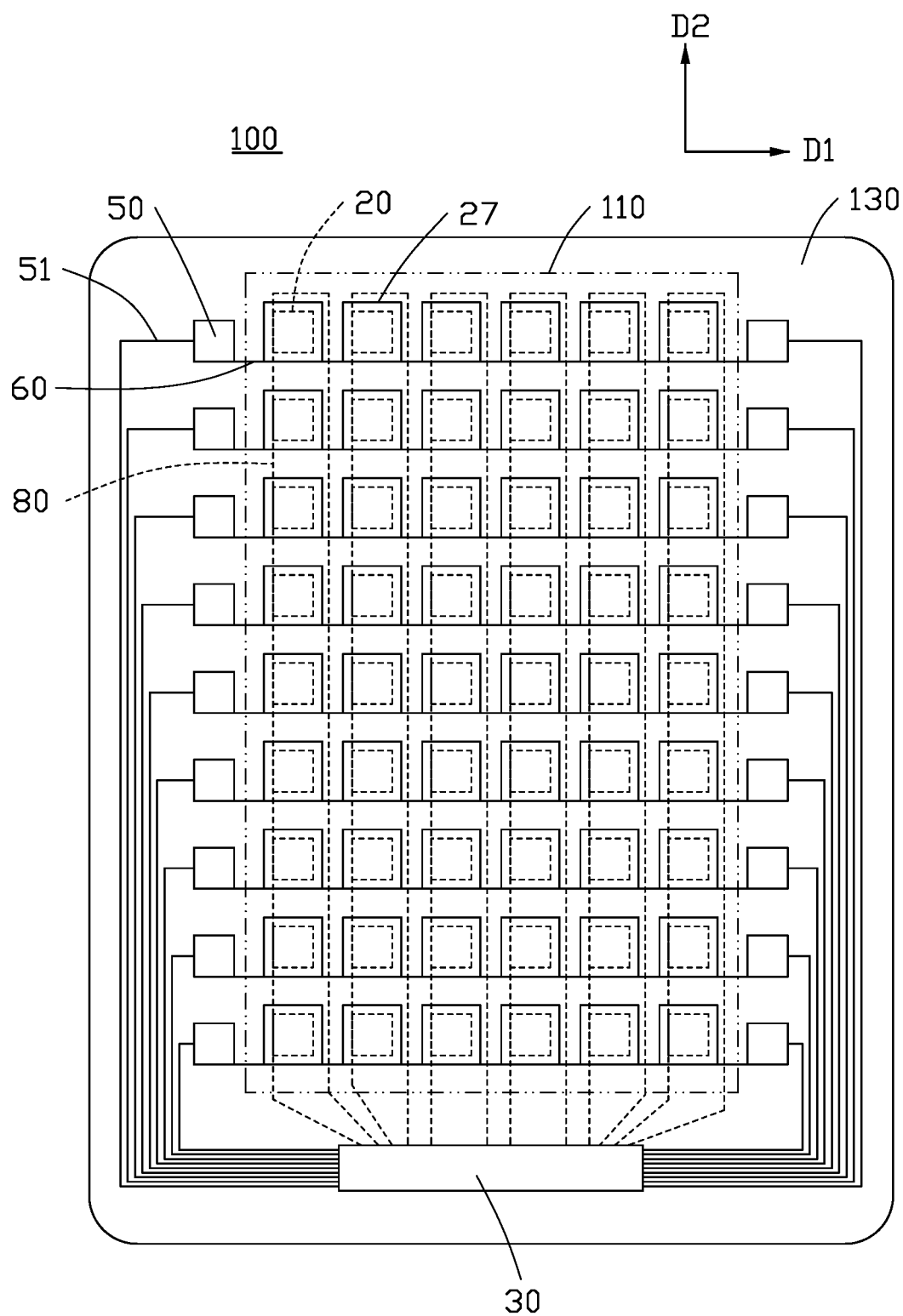
FIG. 1 is a top view illustrating a micro-LED display panel according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to;" it specifically indicates open-ended inclusion or membership in the so-described combination, group, series, and the like.

The Micro-LED in this disclosure refers to an LED having a size less than or equal to a few millimeters (such as several millimeters, hundreds of microns, or less than or equal to 100 microns).

Figure 2:
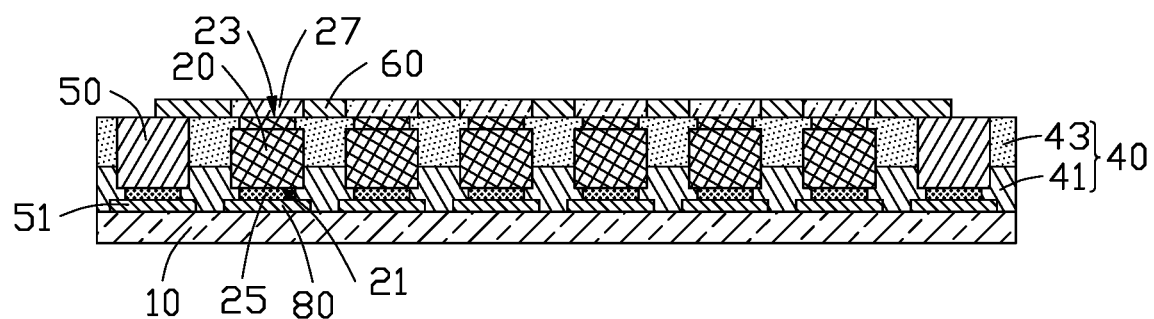
FIG. 2 is a cross-sectional view illustrating the micro-LED display panel along a direction D1 in FIG. 1.

FIG. 1 and FIG. 2 illustrate a micro-LED display panel 100 of an embodiment. The micro-LED display panel 100 includes a plurality of micro-LEDs 20. The area where the micro-LEDs 20 are located defines a display area 110 of the micro-LED display panel 100. The micro-LED display panel 100 includes the display area 110 and a border area 130 surrounding the display area 110. The micro-LEDs 20 are arranged in a matrix of rows and columns. Each row of micro-LEDs 20 extends in a first direction D1, and each column of micro-LEDs 20 extends in a second direction D2. In one embodiment, the first direction D1 and the second direction D2 are perpendicular to each other.

As shown in FIG. 2, the micro-LED display panel 100 further includes a substrate 10 and an insulating layer 40 stacked on the substrate 10. The micro-LEDs 20 are arranged on a surface of the substrate 10 and embedded in the insulating layer 40. The substrate 10 can be made of glass, quartz, etc., but is not so limited. For example, flexible substrate or other substrates that can be applied in mass transferring is also suitable. Each micro-LED 20 has a bottom surface 21 adjacent to the substrate 10 and a top surface 23 away from the substrate 10. The top surface 23 of each micro-LED 20 is exposed from the insulating layer 40. The bottom surface 21 of each micro-LED 20 is connected to a lower electrode 25, and the top surface 23 of each micro-LED 20 is connected to an upper electrode 27. That is, the micro-LED 20 is set vertically, having electrodes connected to the upper and lower sides of the micro-LED 20. The micro-LED display panel 100 includes a plurality of upper electrodes 27 spaced apart from each other, and each upper electrode 27 covers the top surface 23 of a micro-LED 20.

As shown in FIG. 1, the micro-LED display panel 100 further includes a driving circuit 30 in the border area 130. The driving circuit 30 is used to provide voltages to the lower electrode 25 and the upper electrode 27 of each micro-LED 20 to drive the micro-LED 20 to emit light. The lower electrode 25 of each micro-LED 20 is electrically connected to the driving circuit 30 by a bottom wire 80.

As shown in FIG. 1 and FIG. 2, the micro-LED display panel 100 further includes a plurality of conductive blocks 50 arranged in the border area 130, and the micro-LEDs 20, the driving circuit 30, and the conductive blocks 50 are all arranged on the same surface of the substrate 10. As shown in FIG. 1, the conductive blocks 50 are arranged in two columns extending in the second direction D2. The conductive blocks 50 in each column are spaced apart from each other; and the two columns of conductive blocks 50 are located on opposite sides of the display area 110. The driving circuit 30 is directly arranged on the substrate 10 and is located between the two columns of conductive blocks 50. In one embodiment, the conductive blocks 50 are also embedded in the insulating layer 40, and a surface of each conductive block 50 away from the substrate 10 is also exposed from the insulating layer 40. The conductive block 50 can be made of a conventional material which is conductive, such as conductive metal.

The conductive blocks 50 and the driving circuit 30 are arranged on a same surface of the substrate 10. As shown in FIG. 2, a connecting wire 51 is connected to a bottom of each conductive block 50 adjacent to the substrate 10, and the connecting wire 51 is arranged between the substrate 10 and the insulating layer 40. As shown in FIG. 1, the connecting wire 51 extends and is electrically connected to the driving circuit 30, so as to make electrical connection between the conductive block 50 and the driving circuit 30.

In order to achieve electrical connection between the driving circuit 30 and the upper electrodes 27, a plurality of top wires 60 is further provided on the surface of the insulating layer 40 away from the substrate 10 to connect between the upper electrodes 27 and the conductive block 50. In this way, the upper electrode 27 is electrically coupled to the top wire 60. The top wire 60 is electrically coupled to the conductive block 50 and the conductive block 50 is electrically coupled to the connecting wire 51. The connecting wire 51 is electrically connected to the driving circuit 30, which achieves electrical connection between the upper electrode 27 and the driving circuit 30. Since the top wire 60 only extends on the surface of the insulating layer 40 away from the substrate 10, the top wire 60 is not required to climb a slope.

In one embodiment, as shown in FIG. 1, the upper electrodes 27 of each row of micro-LEDs 20 is electrically connected to one single top wire 60, and each top wire 60 extends to connect two conductive blocks on opposite sides of the display area 110. The two conductive blocks 50 are electrically connected to the driving circuit 30. The upper electrodes 27 of the micro-LEDs 20 in different columns are connected to different top wires 60.

In one embodiment, the lower electrodes 25 of each column of micro-LEDs 20 is electrically connected to the driving circuit 30 by one single bottom wire 80. The lower electrodes 25 of the micro-LEDs 20 in different columns are connected to different bottom wires 80. The connecting wires 51 and the bottom wires 80 may be formed by patterning one single conductive layer.

In one embodiment, a height/thickness of the conductive block 50 is equal to that of the micro-LED 20. Alternatively, the height/thickness of the conductive block 50 can be slightly greater than the height/thickness of the micro-LED 20.

In one embodiment, the insulating layer 40 includes a flat layer 41 and a filling layer 43 stacked on the flat layer 41, wherein the flat layer 41 is between the substrate and the filling layer 43. The flat layer 41 and the filling layer 43 can be made of insulating materials, such as silicon oxide, silicon nitride, etc., or an insulating photoresist material may be selected.

The micro-LED display panel 100 realizes the electrical connection between the upper electrodes 27 of the micro-LED 20 and the driving circuit 30 by the conductive blocks 50 on the substrate 10 and the top wires 60 on the insulating layer 40. The top wires 60 only extend on the surface of the insulating layer 40 away from the substrate 10, thus the top wire 60 is not required to be raised.

Figure 3:
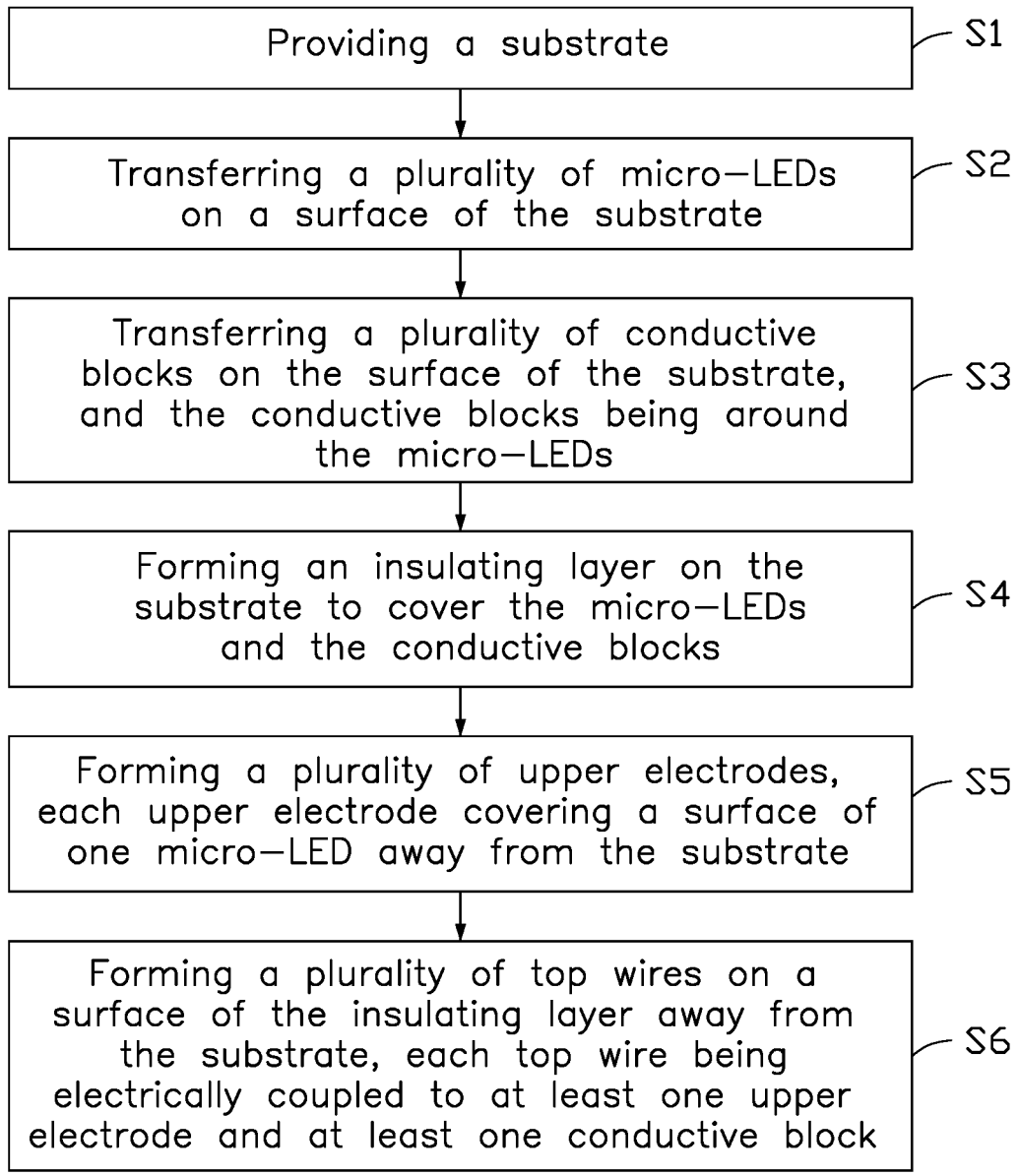
FIG. 3 is a flowchart illustrating a method for making a micro-LED display panel according to an embodiment of the present disclosure.

A method for making the micro-LED display panel 100 is also provided. As shown in FIG. 3, the method includes the following steps. The exemplary method can begin at step S1.

Step S1: providing a substrate 10.

Step S2: transferring a plurality of micro-LEDs 20 on a surface of the substrate 10.

Step S3: transferring a plurality of conductive blocks 50 on the surface of the substrate 10 having the micro-LEDs 20, the plurality of conductive blocks 50 being around the plurality of micro-LEDs 20.

Step S4: forming an insulating layer 40 on the substrate 10, the plurality of micro-LEDs 20 and the plurality of conductive blocks 50 being embedded in the insulating layer 40, and a surface of each micro-LED 20 away from the substrate 10 and a surface of each conductive block 50 away from the substrate 10 being exposed from the insulating layer 40.

Step S5: forming a plurality of upper electrodes 27 on the insulating layer 40, each upper electrode 27 covering a top surface 23 of one micro-LED 20 away from the substrate 10.

Step S6: forming a plurality of top wires 60 on the surface of the insulating layer 40 away from the substrate 10, each top wire 60 being electrically connected to at least one upper electrode 27 and a surface of at least one conductive block 50 away from the substrate 10.

Figure 4:
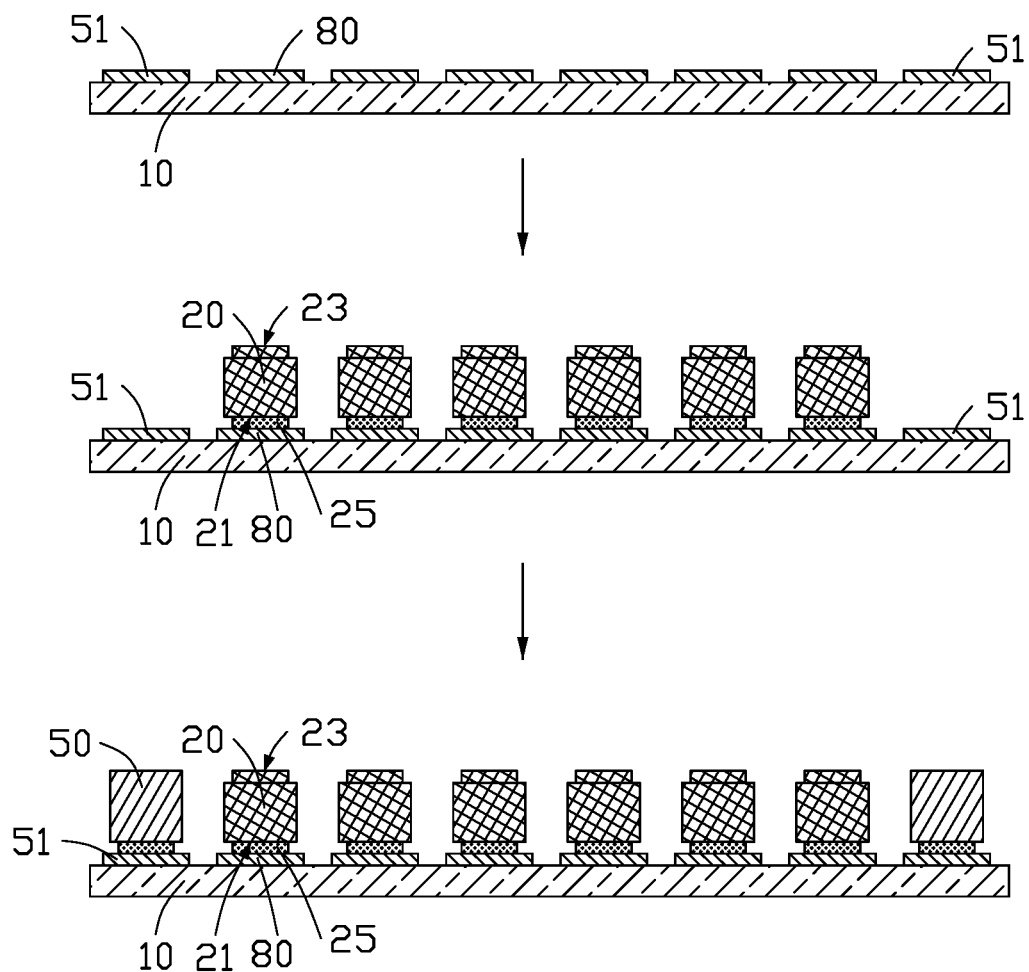
FIG. 4 illustrates steps S1-S3 carried out in making the micro-LED display panel according to an embodiment of the present disclosure.

Step 1 is shown in FIG. 4. In one embodiment, a plurality of bottom wires 80 and a plurality of connecting wires 51 are pre-formed on a surface of the substrate 10, and the bottom wires 80 and the connecting wires 51 can be made of conductive metal material. The substrate 10 can be glass, quartz, or the like. In one embodiment, the bottom wires 80 are arranged parallel to each other. The connecting wires 51 and the bottom wires 80 can be formed by patterning a single metal layer.

The substrate 10 may also carry a driving circuit (not shown in FIG. 4), and the driving circuit 30 is electrically connected to each bottom wire 80 and each connecting wire 51. It can be understood that the driving circuit 30 may also be provided on the substrate 10 in a subsequent step.

Step 2 is shown in FIG. 4. In one embodiment, a mass transferring method can be used to transfer the micro-LEDs 20 on the surface of the substrate 10. A lower electrode 25 is connected to a bottom surface 21 of each micro-LED 20, and the bottom electrode 25 is connected to a bottom wire 80. The bottom electrode 25 may be made of anisotropic conductive glue or eutectic solder.

Step 3 is shown in FIG. 4. In one embodiment, the mass transferring method may be used to transfer the conductive blocks 50 on the substrate 10. After all of the conductive blocks 50 being transferred to the substrate 10, each conductive block 50 is connected to one connecting wire 51. In one embodiment, in order to achieve a better electrical connection to the connecting wire 51, an anisotropic conductive glue or eutectic solder is connected to a bottom of each conductive block 50 adjacent to the substrate 10.

Figure 5:
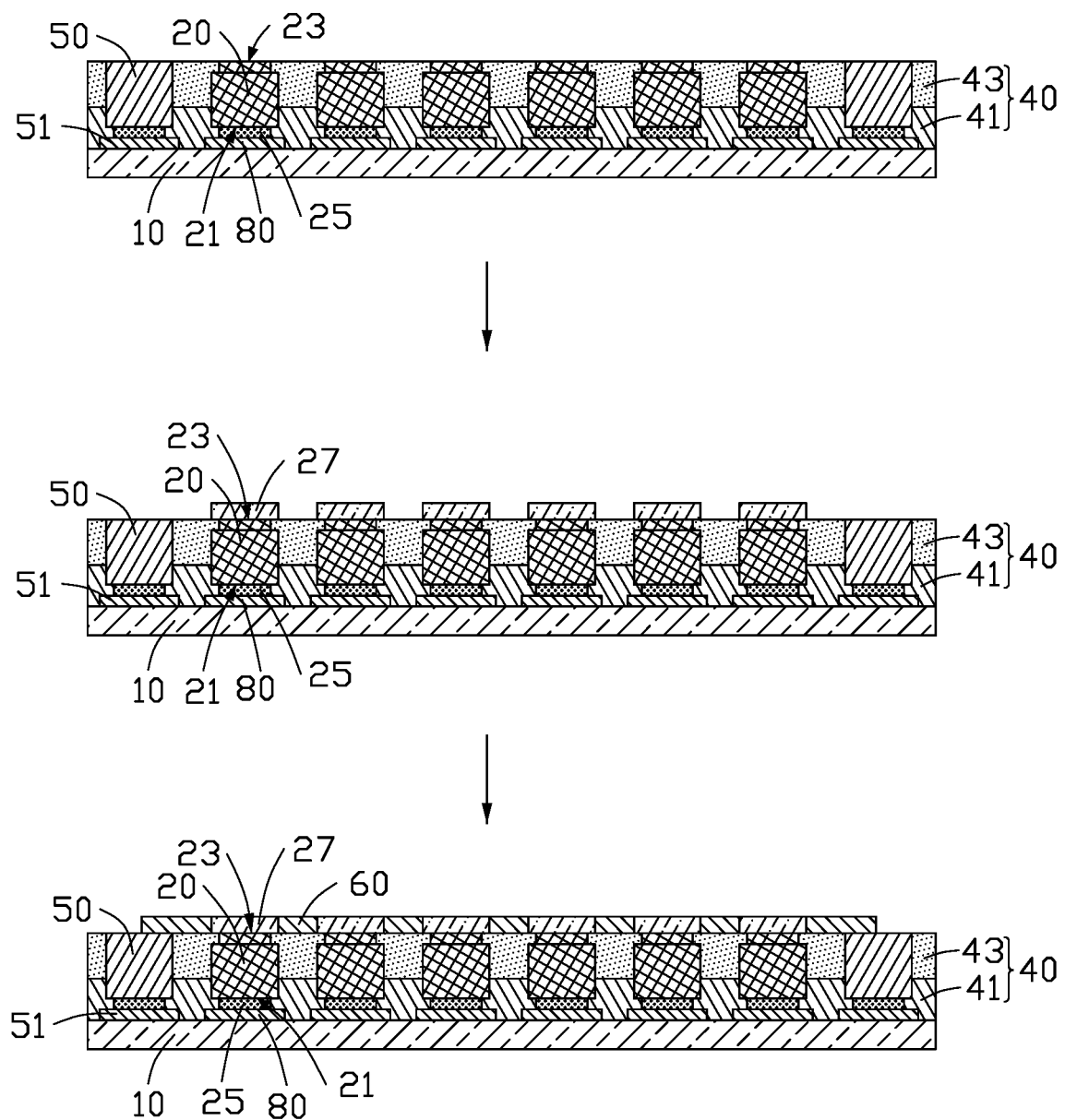
FIG. 5 illustrates steps S4-S6 carried out in making the micro-LED display panel according to an embodiment of the present disclosure.

Step S4 is shown in FIG. 5. In one embodiment, the forming of the insulating layer 40 includes sequentially forming a flat layer 41 and a filling layer 43 stacked on the substrate 10, wherein the flat layer 41 is between the substrate 10 and the filling layer 43. The flat layer 41 and the filling layer 43 can be made of various electrical insulating materials, such as silicon oxide, silicon nitride, and the like. The top surface 23 of each micro-LED 20 and each conductive block 50 away from the substrate 10 are exposed from the insulating layer 40.

Step S5 is shown in FIG. 5. The upper electrodes 27 are made of transparent conductive material, such as indium tin oxide.

Step 6 is shown in FIG. 5. The top wires 60 may be spaced apart from each other and arranged in parallel. Each top wire 60 is connected to the upper electrodes 27 of a row of micro-LEDs 20 and two conductive blocks 50 on both sides of the row of micro-LEDs 20. The top wire 60 can be made of various conductive materials, such as transparent conductive materials (for example, indium tin oxide), and conductive metal materials.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for making a micro-light emitting diode (LED) display panel, comprising:
   providing a substrate;
   transferring a plurality of micro-LEDs on a surface of the substrate;
   transferring a plurality of conductive blocks on the surface of the substrate having the plurality of micro-LEDs, a surface of each of the plurality of conductive blocks away from the substrate being flush with a top surface of each of the plurality of micro-LEDs, and the plurality of conductive blocks being around the plurality of micro-LEDs;
   forming an insulating layer on the substrate to cover the plurality of micro-LEDs and the plurality of conductive blocks, a surface of each of the plurality of micro-LEDs away from the substrate and the surface of each of the plurality of conductive blocks away from the substrate being exposed from the insulating layer;
   forming a plurality of upper electrodes, each of the plurality of upper electrodes covering a surface of one of the plurality of micro-LEDs away from the substrate; and
   forming a plurality of top wires on a surface of the insulating layer away from the substrate, each of the plurality of top wires being electrically coupled to at least one of the plurality of upper electrodes and at least one of the plurality of conductive blocks.

2. The method of claim 1, wherein providing the substrate further comprises:
   providing the substrate with a plurality of bottom wires, a plurality of connecting wires, and a driving circuit on a surface of the substrate, each of the plurality of bottom wires and each of the plurality of connecting wires are electrically connected to the driving circuit.

3. The method of claim 1, wherein transferring the plurality of micro-LEDs is carried out by a mass transferring method.

4. The method of claim 2, wherein a bottom surface of each of the plurality of micro-LEDs is provided a lower electrode, after transferring the plurality of micro-LEDs, the lower electrode is connected to one of the plurality of bottom wires.

5. The method of claim 1, wherein transferring the plurality of conductive blocks is carried out by a mass transferring method.

6. The method of claim 2, wherein after transferring the plurality of conductive blocks, each of the plurality of conductive blocks is electrically connected to one of the plurality of connecting wires.

7. The method of claim 1, wherein after transferring the plurality of micro-LEDs on the substrate, the plurality of micro-LEDs is arranged in a matrix having a plurality of rows and a plurality of columns, and
   forming the plurality of top wires further comprises forming a plurality of top wires parallel to each other and spaced apart from each other, each of the plurality of top wires is electrically coupled to one of the plurality of upper electrodes covering the one of the plurality of micro-LEDs in one of the plurality of rows and two of the plurality of conductive blocks on opposite sides of the one of the plurality of rows.

8. The method of claim 1, wherein each of the plurality of top wires is in direct contact with and electrically coupled to the surface of each of the plurality of conductive blocks away from the substrate.

* * * * *